United States Patent [19]
Oldendorf et al.

[11] Patent Number: 5,627,729
[45] Date of Patent: May 6, 1997

[54] ONE-PIECE MEMORY CARD

[75] Inventors: John Oldendorf, Prospect Heights; Mark Stack, Hoffman Estates, both of Ill.

[73] Assignee: Methode Electronics, Inc., Chicago, Ill.

[21] Appl. No.: 415,698

[22] Filed: Apr. 3, 1995

[51] Int. Cl.$^6$ ........................................ H05K 1/14
[52] U.S. Cl. .......................... 361/737; 361/753; 361/816; 361/748; 439/946
[58] Field of Search ...................... 439/946, 629, 439/630, 636, 79, 76.1; 257/678; 361/737, 753, 816, 818, 736, 748; 174/35 R, 35 GC; 235/487, 488, 492, 380, 392

[56] References Cited

U.S. PATENT DOCUMENTS 4,780,793  10/1988  Ohtsuki .
5,229,919   7/1993  Chen .
5,393,250   2/1995  Richardson et al. .................... 439/825
5,505,628   4/1996  Ramey et al. .......................... 439/76.1

Primary Examiner—Leo P. Picard
Assistant Examiner—Anthony Dinkins
Attorney, Agent, or Firm—David L. Newman

[57] ABSTRACT

A memory card assembly is provided having a one-piece construction including a cardedge receptacle for slidingly receiving the conductive fingers of a printed circuit board and providing for an electrical connection without soldering. The one-piece construction is achieved by the injection molding of an internal frame to capture the protruding edges of the top and bottom metallic covers. Sufficient normal force of the cardedge receptacle is maintained by a brace member.

15 Claims, 3 Drawing Sheets

ONE-PIECE MEMORY CARD

BACKGROUND OF THE INVENTION

This invention pertains to integrated circuit memory cards and, in particular, a one-piece memory card assembly.

Integrated circuit cards and mating sockets of free insertion and withdrawal capability enabling the storage of large amounts of information and enacting logical and calculating functions have been developed to comprise thin, card-like plastic and metallic outer packages which house a frame and a semi-conductor/integrated circuit device and an electrical connector for electrically connecting the semi-conductor device to external equipment. Such devices will be referred to hereinafter as memory cards. The memory cards have found widespread use as storage devices for data and programs for video games and microcomputers. A conventional memory card has a plastic and metallic outer package consisting of an upper section, a lower section and a frame. The two sections package or surround and protect the integrated circuit devices on a printed circuit board encased therein. PCMCIA (Personal Computer Memory Card International Association) standards specify the external dimensions for the memory cards.

It has been known in the art to have two or three-piece memory card assemblies. Generally, these memory card assemblies include a top cover and a bottom cover which are in a disassembled state prior to the mounting of a printed circuit board having integrated circuits thereon. Once the printed circuit board is mounted to the frame or the frame attached to a bottom cover, for example, the top cover is then attached to the printed circuit board bottom cover assembly and bonded together in some way such as a mechanical fit or by use of adhesives. Such a two or three-piece assembly is a difficult and timely procedure. The assembly is made even more difficult in than an electrical connector must also be attached to the printed circuit board and the frame during the assembly process. Prior art methods require the attachment of the electrical connector to the printed circuit board by soldering which is a labor intensive difficult process. Further, in some situations, once the memory card assembly has been fully assembled with the memory card mounted therein, the memory card assembly must be disassembled for further testing or to modify the printed circuit board. Due to the complicated nature of such prior art memory card assemblies, such assembly and disassembly is near impossible to successfully accomplish in short periods of time. Such disassembly may destroy covers or frames or electrical connectors. Accordingly, there is desired a memory card assembly which can overcome the above-mentioned disadvantages.

SUMMARY OF THE INVENTION

A principal object of this invention is to provide a memory card assembly which does not require assembly or disassembly in order to mount a printed circuit board therein.

It is another object of the present invention to provide a memory card assembly into which a printed circuit board may be inserted and removed easily and with multiple insertion/extractions.

It is a further object of the present invention to provide a memory card assembly which provides for a simplified means of testing a printed circuit board.

It is another object of the present invention to provide a memory card assembly which may be assembled without the use of bonding or adhesives.

It is a further object of the present invention to provide a memory card assembly which eliminates the need for soldering of a circuit board mounted within the memory card assembly to an electrical connector.

It is another object of the present invention to provide a memory card assembly which allows for a printed circuit board to be mounted therein via sliding the printed circuit board into the memory card assembly cavity.

According to the above objects, a memory card assembly for housing a semi-conductor device is provided comprising a top metallic cover, a bottom metallic cover attached to the top cover and providing a six-sided structure defining a cavity having an open first end for receiving a circuit board and a second end bounded by an electrical connector attachable to the circuit board. The electrical connector may be a cardedge receptacle having contacts protruding within the cavity and the circuit board having conductive fingers thereon for slidingly engaging the contacts. A brace member is provided adjacent the contact. The top cover includes a top distal end which protrudes inwardly toward the cavity and abuts a bottom distal end of the bottom cover and an internal rail surrounding the abutting distal ends. The internal rail may be injection molded around the distal ends of the covers. A cap may be attached to the first end. The circuit board is slidably received by the cavity. A receptacle end face is provided attached to the second end. The receptacle end face may be injection molded over the electrical connector. The receptacle end face may be integrally molded with the electrical connector.

In an embodiment, a memory card assembly for housing a semi-conductor device comprises a housing having a first end and a second end, an opening at the first end, a cavity defined between the first end and the second end for receiving a circuit board therein and the circuit board slidably inserted within the cavity and connected to the electrical connector via a solderless connection. The second end may be enclosed by the electrical connector. The first end may be enclosed by an electrical connector or cap. In an alternative embodiment, the first end may be enclosed by an I/O connector mounted to the circuit board. The electrical connector includes a contact protruding within the cavity and defining a gap thereunder and the circuit board slidably received in the gap.

A method of forming a memory card assembly for housing a semi-conductor device is provided, including the steps of aligning a top and bottom cover in a side-by-side arrangement to define a cavity therebetween and a first end and second end having edges running therebetween and injection molding an internal rail along the edges in order to attach together the covers and the electrical connector as one piece. The method also including the step of inserting an electrical connector at an end of the memory card assembly. The method also including the step of injection molding a sidewall having a keying portion. A receptacle end face is injection molded over the electrical connector. A circuit board is mounted within the assembly by sliding the circuit board into the cavity through a first end wherein conductive fingers of the circuit board slidingly engage contacts of the electrical connector at the second end. The method wherein the assembly is enclosed by attaching a cap over the first end. The assembly is disassembled by inserting a tool at a first end of the assembly to release the cap from the first end and slidingly removing the circuit board from the cavity.

These and other features of the invention are set forth below in the following detailed description of the presently preferred embodiments.

DETAILED DESCRIPTION OF THE PRESENTLY PREFERRED EMBODIMENTS

The present invention relates to a memory card assembly as best described by FIGS. 1–7.

Figure 1:
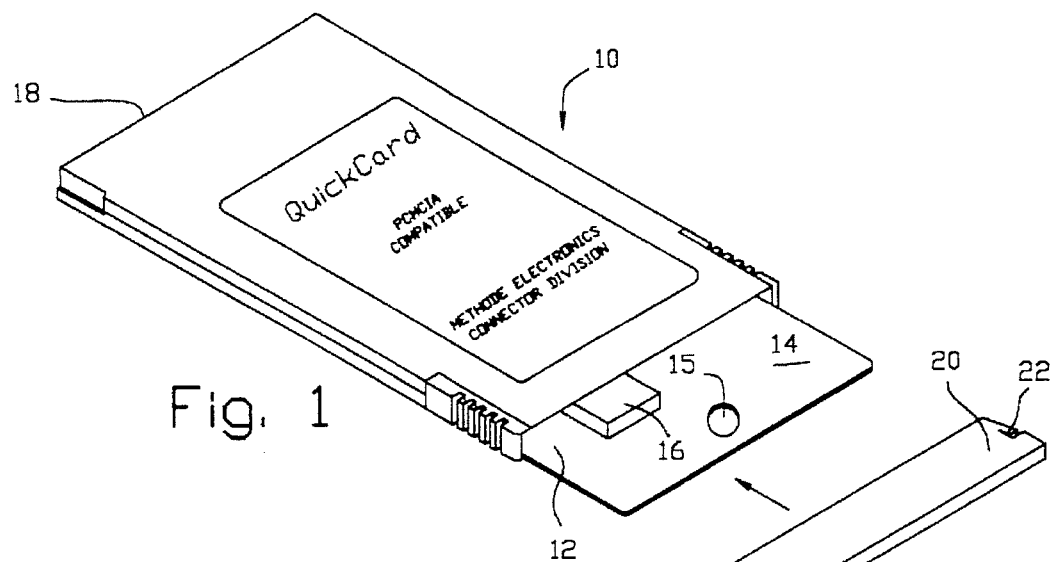
FIG. 1 is a perspective view of the memory card of the present invention showing a printed circuit board being inserted within the memory card.

FIG. 1 is a perspective view of the memory card assembly 10 of the present invention showing a one-piece assembly being enclosed on the top and bottom and three sides and having a first end 12 open for receiving a printed circuit board 14 to be slidingly received within the memory card assembly 10. The printed circuit board 14 has mounted thereon ICs 16 and other components for providing the specific functioning for the memory card application required by the manufacturer. An electrical connector such as a receptacle is mounted at the second end 18 of the memory card assembly 10. Due to this construction the printed circuit board 14 may be easily slid within the memory card assembly 10 from first end 12 toward the second end 18. Upon complete insertion, the printed circuit board 14 is electrically connected to the memory card assembly 10. As discussed below, the present invention provides for a solderless attachment of the printed circuit board to the electrical connector. After full insertion of the printed circuit board 14, a cap 20 may be placed over the first end 12 in order to secure the printed circuit board 14 within the memory card assembly 10. The cap 20 is preferably molded of a polymer material having tabs 21,22 for mechanically securing the cap 20 to the memory card assembly 10. A tool may be used to remove the cap 20 from the memory card assembly 10. Once the cap 20 is removed, the printed circuit board 14 may easily be removed via a tool hooking hole 15 in the printed circuit board 14 and pulling the printed circuit board 14 from within the memory card assembly 10. Such a procedure may be quickly and easily accomplished without destroying either the memory card assembly 10 or any of the components on the printed circuit board 14. According to the design of the present invention, this insertion and extraction of the printed circuit board may be accomplished over multiple cycles. Thus, it may be desirable for the testing of the printed circuit board 14 to occur by inserting the printed circuit board in the memory card assembly 10 and then attaching the memory card assembly 10 to test equipment to determine the functionality of the components on the printed circuit board 14. It can be appreciated that this one-piece memory card assembly 10 is quickly and easily assembled and provides for a robust mid sturdy design, as will be discussed further below.

In an alternative embodiment, the second end 18 of the memory card assembly 10 does not have a receptacle connector mounted therein but is bounded by a polymer material such as an injection molded end. A receptacle may then be attached to an edge of the printed circuit board 14 and the printed circuit board may then be slid through the first end 12 and upon full insertion within the memory card assembly 10, the receptacle attached to the printed circuit board encloses the first end 12. A further alternative embodiment would be the same construction as above except the printed circuit board 14 is inserted through the first end 12 prior to attachment of a receptacle and after complete insertion of the printed circuit board 14 within the memory card assembly 10, a receptacle (replacing the cap 20, FIG. 1) is attached to the printed circuit board 14 and encloses the first end 12.

Figure 2:
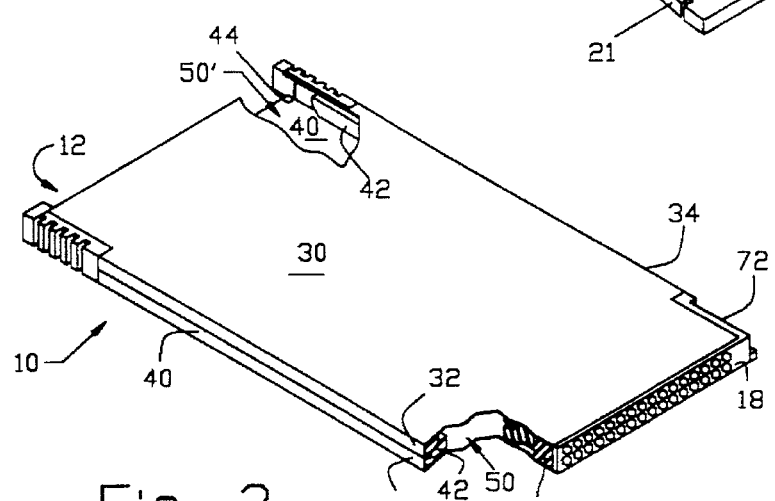
FIG. 2 is a perspective view of the memory card having a partially exposed cut-away view.

FIG. 2 is a perspective view of the memory card assembly 10 having first end 12 and second end 18. In other words, the memory card assembly 10 in FIG. 2 is in a rotated orientation from FIG. 1. The memory card assembly 10 is constructed of a top cover 30 and a bottom cover 40. In a preferred embodiment, each cover is an integrally formed metal cover having an L-shaped edge 32,34 formed at each side. The bottom cover 40 also has a L-shaped edge 36. The top and bottom covers 30,40 are held together by an internal rail 42 which holds the distal ends of the L-shaped edges 32,36. In a preferred embodiment, the internal rail 42 is injection molded over the distal ends of the; edges 32,36 of the top and bottom covers 30,40. Thus, it can be seen that a rigid overall housing is formed by the covers 30,40 and the internal rail 42 which forms a cavity 50 for receiving a printed circuit board.

While the second end 18 of the cavity 50 is completely enclosed, the first end 12 of the cavity 50' is exposed, allowing for the insertion of a printed circuit board from the first end 12. At the first end 12 a printed circuit board may be slid along the interior surface of the bottom cover 40 between the internal rails 42 until the printed circuit board reaches its fully mated position within the memory card assembly 10. In an alternative embodiment, the internal rail 42 may be molded having protrusions which extend over the printed circuit board and help to secure the printed circuit board within the cavity 50 and in guiding the printed circuit board through the cavity 50. Upon full insertion of the printed circuit board within cavity 50, a cap may be secured over the first end 12. Latching tabs of the cap abut pillar 44. At the second end 18 of the memory card assembly 10 is electrical connector 60. The connector 60 includes a receptacle end 61 and a contact end 62. The connector 60 and its assembly within the memory card assembly 10 will be discussed in greater detail below.

Figure 3:
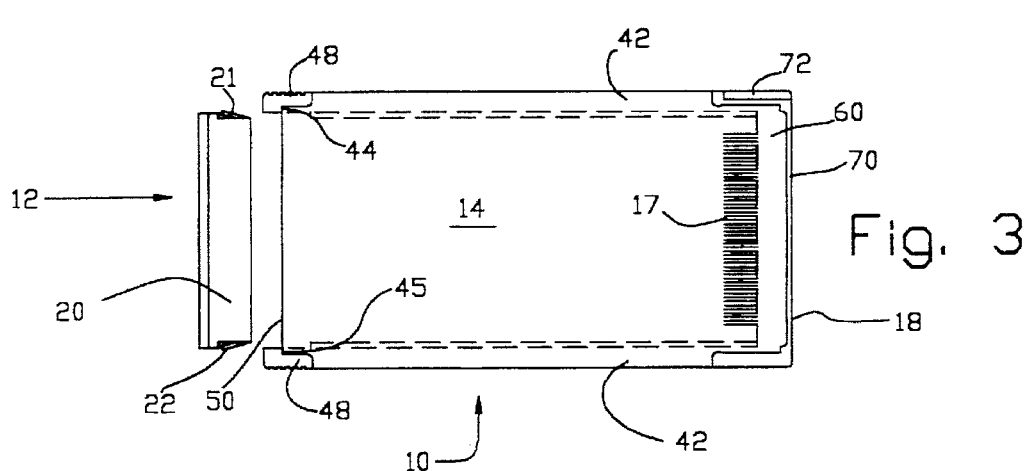
FIG. 3 is a plan view of the memory card of FIG. 2.

Turning to FIG. 3, a plan view of the; memory card assembly 10 of the present invention is shown having first end 12 having cap 20 be attachable to the first end 12 in order to enclose the cavity 50. The cap 20 includes latch 21 and 22 which upon initial insertion into cavity 50 will be pressed against the body of the cap 20. Upon reaching the fully mated position of the cap within the first end 12, the latches 21,22 will spring back and engage pillars 44,45 of the sidewall 48 of the memory card assembly 10. In an alternative embodiment, the cap 20 may be replaced by an I/O connector for attaching external peripheral devices to the memory card. The I/O connector may attach to the memory card assembly similar to the cap 20 and to the PCB similar to the electrical connector 60 discussed below. FIG. 3 shows a printed circuit board 14 held within cavity 50 of the memory card assembly 10. The printed circuit board 10 includes conductive fingers 17 along its edge; for electrical connection to electrical connector 60 mounted at the second end 18 of memory card assembly 10. A receptacle end face 70 covers the electrical connector 60 at the second end 18. Keying portion 72 is included in sidewall 48 to provide polarization for the memory card assembly 10.

FIG. 3 discloses the one-piece construction of the memory card assembly 10. In a preferred embodiment, internal rail 42, sidewall 48, keying portion 72 and end face 70 are all simultaneously injection molded to the covers 30,40 and electrical connector 60 to provide a rigid one-piece housing having six-sides and only the first end 12 being open.

Figure 4:
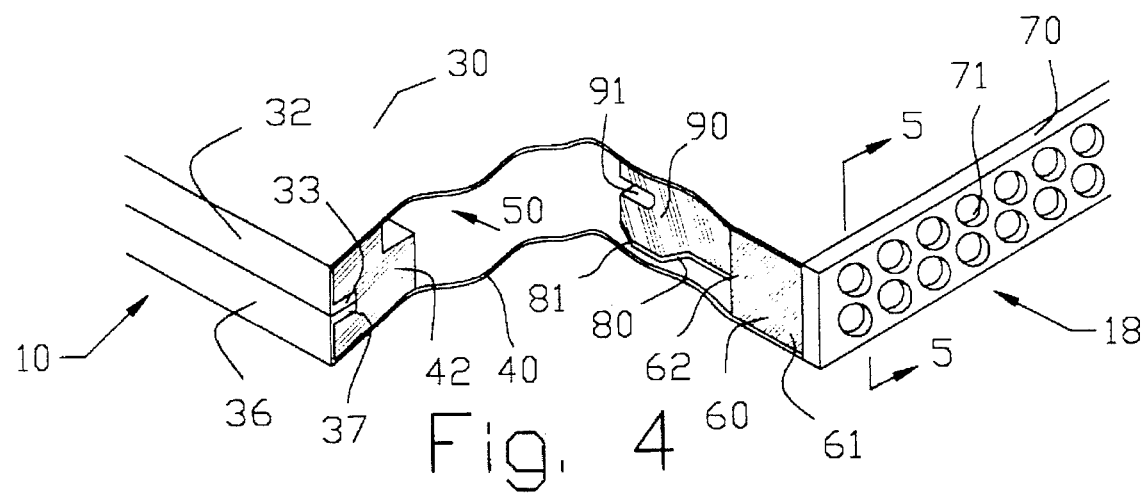
FIG. 4 is an enlarged perspective partially cut-away view of FIG. 2.

FIG. 4 is an enlarged partially cut-away perspective view of FIG. 2 of the memory card assembly 10. Covers 30 and 40 include L-shaped edges 32 and 36 having a top distal end 33, and a bottom distal end 37 which protrude inwardly toward the cavity 50. The distal ends 33,37 of the covers 30,40 abut each other and are attached together by internal rail 42.

At the second end 18 of the memory card assembly 10 is electrical connector 60 which includes a receptacle end 61 and contact end 62. Projecting from the contact end 62 of the connector 60 toward cavity 50 is PCB contact 80 protruding into the cavity 50. The PCB contact 80 includes a wiping surface 81 for wiping against the conductive fingers of the printed circuit board when slid thereunder. A brace member 90 abuts against the PCB contact 80 opposite the wiping surface 81. The brace 90 applies a continuous force against PCB contact 80 which is transferred to the contact so that upon sliding of a printed circuit board under PCB contact 80, a continuous normal force is maintained by the PCB contact 80 and a non-intermittent electrical connection is made to the conductive fingers of the printed circuit board inserted therein. The brace member 90 also includes cut-out 91 to provide resiliency to the brace member 90.

The electrical connector 60 is maintained and held within the memory card assembly 10 also by internal rail 42. Simultaneously while the internal rail 42 is injection molded around the edges 32,36 of the covers 30,40, a portion is also molded around the ends of the electrical connector 60 to trap it between the covers 30, 40. Simultaneously, receptacle end face 70 is also molded over the second end 18 of the memory card assembly 10. The receptacle end face 70 is molded having holes 71 corresponding with the apertures of the connector 60 in which reside contacts for receiving pins of a header of a host device. The molding of the receptacle end face 70 provides for a finished second end 18 of the memory card assembly 10 and covers the bare projecting lips of the top cover and bottom cover 30,40. Having these front lips of the metal covers trapped in plastic, avoids catching on a host device to which the memory card assembly is being inserted or having a sharp edge cut a user's finger.

Figure 5:
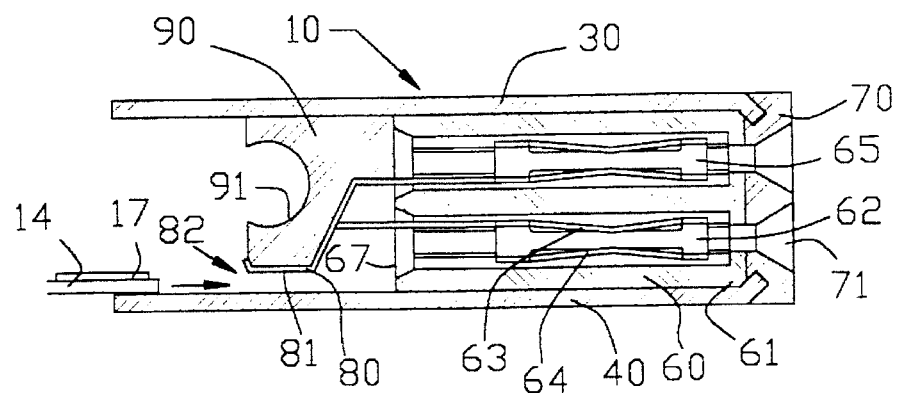
FIG. 5 is an enlarged side-elevation cut-away view of FIG. 4, taken at line 5—5.

Turning to FIG. 5, an enlarged side, elevation cut-away view of FIG. 4 taken at line 5—5 is shown. An electrical connector 60 is shown mounted in between top cover 30 and bottom cover 40. In a preferred embodiment, the electrical connector is a 68-position cardedge receptacle. While it may be seen that FIG. 5 displays only two contacts, it may be understood that adjacent the exposed contacts are 34 additional pairs of contacts. The receptacle end 61 of the connector 60 includes apertures 62 which correspond to hole 71 of the receptacle end face 70. In a preferred embodiment, a pair of receptacle contacts 63,64 are provided for receiving a pin of a header of a host device. For example, the memory card assembly 10 may be inserted into a PCMCIA slot of a lap top computer having a 68-position header at the back of the slot. The pins of the header will be inserted into the corresponding apertures 62 of the electrical connector 60 of the memory card assembly 10. The receptacle contacts 63,64 will provide dual wiping surfaces to provide electrical connection with the pin received therebetween. An upper aperture 65 provides for a similar electrical connection to a pin received therein. The contacts of the lower aperture 62 and upper aperture 65 are combined and provide electrical connection to PCB contact 80. The PCB contact 80 includes wiping surface 81. A gap 82 is provided for receiving a printed circuit board 14 thereunder. Brace member 90 abuts the PCB contact 80 at the side opposite the wiping surface 81 to maintain a normal force of the PCB contact 80. The brace member 90 also includes cut-out 91 to provide for resiliency of the brace member 90. The brace member 90 may be attached to or formed as part of the electrical connector 60. The brace member 90 may also include protruding ribs which protrude between the printed circuit board contacts 80 and inhibit shorting of the contacts and also retain the printed circuit board contacts 80 in a uniformly spaced position in order that the PCB contact 80 lines up with its corresponding conductive finger 17 of the printed circuit board 14 slid thereunder.

The assembly of the memory card assembly 10 requires only the insertion of the printed circuit board, as the memory card frame and covers are of a one-piece construction. A printed circuit board is slid along the inner surface of the bottom cover 40 toward gap 82. The printed circuit board 14 has conductive finger 17 thereon and upon sliding of the printed circuit board into gap 82, the conductive finger 17, will abut the wiping surface of the PCB contact 80. As the brace member 90 pushes against the PCB contact 80, a sufficient normal force is maintained between the PCB contact 80 and the conductive finger 17. The printed circuit board 14 will be fully mated when it is entirely inserted within gap 82 and it abuts end wall 67 of the connector 60. Thus, it is apparent that a solderless electrical connection is achieved by the arrangement of the present invention. Elimination of the necessary solder connection of prior art memory card assemblies eliminates a time-consuming and difficult process. However, in an alternative embodiment, the entire memory card assembly 10 after insertion of the printed circuit board may be exposed to heat in order to reflow the solder finger 17 to provide an electrical connection between the conductive finger 17 and PCB contact 80.

Accordingly, a preferred method of manufacturing the present invention includes the steps of:

1. Aligning a top and bottom cover in side-by-side arrangement to define a cavity therebetween and a first and second end having edges running therebetween;
2. Inserting an electrical connector at the second end; and
3. Injection molding an internal rail along the edges in order to attach together the covers and electrical connector as one piece.

In a preferred embodiment, the injection molded material is a polymer material such as liquid crystal polymer.

Figure 6:
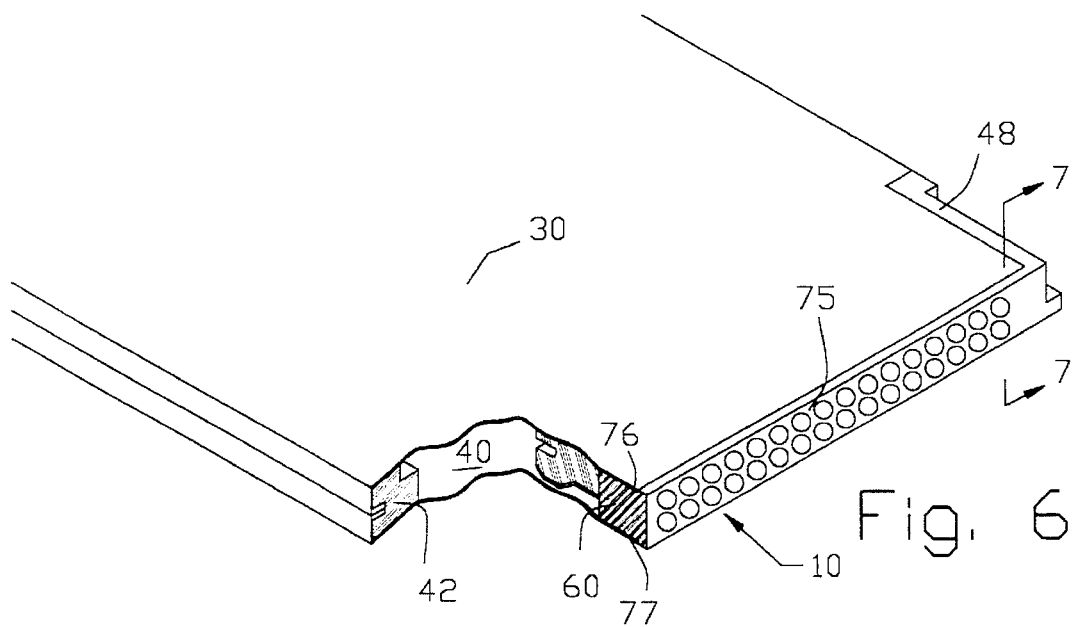
FIG. 6 is a perspective partially cut-away view of an alternative embodiment of a memory card of the present invention.

Turning to FIG. 6, an alternative embodiment of the present invention is shown having electrical connector 60 having integrally molded thereon a receptacle end face 75. While the internal rail 42 and sidewall 48 of the memory card assembly of an alternative embodiment are injection molded, the receptacle end face 75 is omitted. Thus, the end face 75 includes a lip 76,77 which abuts the end of the top cover 30 and bottom cover 40 in order to cover the stray metal lips.

Figure 7:
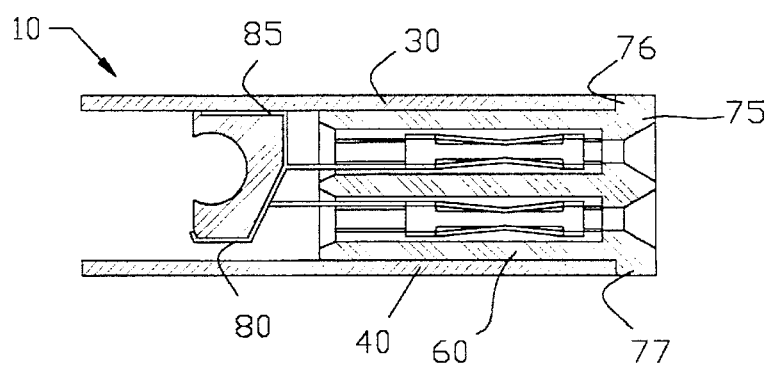
FIG. 7 is an enlarged side-elevation cut-away view of FIG. 6 taken at line 7—7.

FIG. 7 is an enlarged side elevation cut-away view of FIG. 6 taken at line 7—7 showing the integrally molded receptacle end cap 75 with the electrical connector 60. The lip 76 and 77 which protects the ends of the top cover 30 and bottom cover 40.

Also disclosed in FIG. 7 is ground tab 85 which, in a preferred embodiment, is formed with PCB contact 80 and projects oppositely of the contact 80 toward top cover 30 and provides for grounding of the memory card assembly 10 via top cover 30 through ground tab 80 and electrical connector 60 to the host device attached thereto. It should be noted that FIG. 7 is a cross-section of the memory card assembly 10 of FIG. 6 taken at the end, or last contact position of the electrical connector 60. In a preferred embodiment, a ground tab 85 is located at each end of the electrical connector 60 and all PCB contacts 80 therebetween do not have ground tabs 85, as shown in FIG. 5. It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A one-piece memory card assembly for housing a semi-conductor device comprising:

a top metallic cover;

a bottom metallic cover attached to the top cover and providing a one-piece six-sided structure defining a cavity having an open first end for receiving a circuit board; and a second end bounded by an electrical connector attachable to the circuit board wherein the electrical connector includes a first side having an aperture having a receptacle contact mounted therein for receiving a contact pin of an external device and a second side having a PCB contact protruding transversely therefrom and electrically connected to the receptacle and the PCB contact having a wiping area spaced from the bottom metallic cover forming a gap in communication with the cavity for receiving an edge of the circuit board therein, the edge having conductive fingers thereon for slidingly engaging the wiping area of the PCB contact to carry electrical signals between the circuit board and the electrical connector.

2. The memory card of claim 1 wherein the electrical connector includes a cardedge receptacle at the second side having the PCB contacts protruding within the cavity; and the circuit board having conductive fingers thereon for slidingly engaging the PCB contacts.

3. The memory card of claim 2 wherein a brace member is attached to the second side of the electrical connector adjacent the PCB contacts in order to provide a strain relief for the PCB contacts.

4. The memory card of claim 1 wherein the top cover includes a top distal end which protrudes inwardly toward the cavity and abuts a bottom distal end of the bottom cover; and an internal rail injection molded around the abutting distal ends of the top and bottom covers.

5. The memory card of claim 1 wherein a cap is attached to the first end.

6. The memory card of claim 1 wherein the circuit board is slidably received by the cavity.

7. The memory card of claim 1 including a receptacle end face attached to the second end.

8. The memory card of claim 7 wherein the receptacle end face is injection molded over the electrical connector.

9. The memory card of claim 7 wherein the receptacle end face is integrally molded with the electrical connector.

10. A memory card assembly for housing a semi-conductor device comprising:

a one-piece housing having a first end and second end;

an opening at the first end;

a cavity defined between the first end and second end for slidably receiving a circuit board therein; and an electrical connector mounted at the second end and including a PCB contact protruding within the cavity and slidingly engaging a conductive finger of the circuit board to carry electrical signals between the circuit board and the electrical connector via a solderless connection.

11. The memory card of claim 10 wherein the second end is enclosed by the electrical connector.

12. The memory card of claim 10 wherein the first end is enclosed by the electrical connector.

13. The memory card of claim 10 wherein the first end is enclosed by a cap.

14. The memory card of claim 10 wherein the first end is enclosed by an I/O connector mounted to the circuit board.

15. The memory card of claim 10 wherein the PCB contact protrudes within the cavity and defines a gap thereunder having a width slightly larger than a width of an edge of the circuit board; and the circuit board slidably received in the gap.

* * * * *